United States Patent [19]

Learn

[11] 4,225,856
[45] Sep. 30, 1980

[54] CIRCUIT MEANS FOR PROVIDING MULTIPLE AUDIBLE SIGNALS FROM AN AUDIBLE TONE GENERATOR MEANS

[75] Inventor: Richard L. Learn, Indianapolis, Ind.

[73] Assignee: Emhart Industries, Inc., Indianapolis, Ind.

[21] Appl. No.: 955,267

[22] Filed: Oct. 27, 1978

[51] Int. Cl.³ .............................................. G08B 3/00
[52] U.S. Cl. .............................. 340/384 E; 340/384 R
[58] Field of Search ...................... 340/384 E, 384 R; 331/64, 65

[56] References Cited

U.S. PATENT DOCUMENTS

| | | | |
|---|---|---|---|
| 3,922,672 | 11/1975 | Birt | 340/384 E |
| 3,978,475 | 8/1976 | Schmitz | 340/384 E |

*Primary Examiner*—Harold I. Pitts
*Attorney, Agent, or Firm*—Hoffmann & Meyer

[57] ABSTRACT

A circuit for providing a plurality of distinguishable audible signals from an audible tone generator includes at least two gates wherein the output of one of the gates determines the type of audible signal produced by the audible tone generator in response thereto. The circuit further includes a single control terminal for controlling the logical state the output of the one gate and for controlling the type of audible signal produced by the audible tone generator. The absence of an electrical potential at the control terminal when power is applied to the circuit results in a latching of the output of the one gate and the production of a continuous audible signal by the audible tone generator. The presence of an electrical potential at the control terminal when power is applied to the circuit results in a periodic changing of the output of the one gate and the production of an interrupted audible signal by the audible tone generator.

3 Claims, 4 Drawing Figures

CIRCUIT MEANS FOR PROVIDING MULTIPLE AUDIBLE SIGNALS FROM AN AUDIBLE TONE GENERATOR MEANS

BACKGROUND OF THE INVENTION

1. Field of the Invention

The present invention relates to audible tone generator means and more particularly to circuit means for providing various electrical signals whereby the audible tone generator means produces a plurality of distinguishable audible signals in response to the various electrical signals.

Generally speaking, the circuit means of the present invention includes at least two gates wherein the output of one of the gates determines the type of audible signal produced by the audible tone generator means. The circuit includes a single control terminal for controlling the logical state of the output of the one gate and for therefore controlling the type of audible signal produced by the audible tone generator means.

2. Description of the Prior Art

A number of audible tone generator devices are well known to those skilled in the art such as a piezoelectric transducer, an electromechanical buzzer, a horn, a speaker, etc. With the appropriate drive circuit means electrically coupled to these conventional audible tone generator devices they can be driven to produce a single audible signal.

Many times it is desirable that a single audible tone generator device produce two or more distinguishable audible signals to indicate the existence or nonexistence of two or more conditions. Accordingly, either an additional drive circuit is required or the original drive circuit must be changed in some fashion to provide a different electrical drive signal for each condition.

In U.S. Pat. No. 3,922,672 issued Nov. 25, 1975 to Thomas W. Birt, et al. a drive circuit means is disclosed which is capable of providing different electrical signals whereby an audible tone generator means produces two distinguishable audible signals. As disclosed in the Birt, et al. patent, the drive circuit means requires at least two control terminals to provide the different electrical signals which will produce the two audible signals. Accordingly, one input of each of the logic gates included in the Birt, et al. drive circuit means are controlled by an external electrical signal applied at each of the control terminals electrically coupled thereto.

The present invention accomplishes the same result as the Birt, et al. drive circuit means described hereinabove utilizing fewer electrical components by requiring only one control terminal for controlling an input of only one of the logic gates.

SUMMARY OF THE INVENTION

In accordance with the present invention in its broadest concept there is provided a circuit means for providing multiple audible signals from an audible tone generator means which utilizes a single control terminal to control the output of the circuit means in response to various conditions whereby distinguishable audible signals indicative of such conditions are produced by the audible tone generator means in response to the output of the circuit means.

Accordingly, it is a feature of the present invention to provide a circuit means as described hereinabove which includes at least two logic gates wherein the state of an input of only one of the logic gates is controlled by the electrical potential of the control terminal.

It is another feature of the present invention to provide a circuit means as previously described wherein a first audible signal is produced by the audible tone generator means in response to the absence of an electrical potential at the control terminal and a second audible signal distinguishable from the first audible signal is produced in response to the presence of an electrical potential at the control terminal.

Yet another feature of the present invention is to provide a method for providing multiple audible signals from an audible tone generator means which includes the step of controlling an output of a logic gate circuit means from a single control terminal whereby various states of the output correspond to various conditions.

Other features and advantages of the present invention will be apparent from the following detailed description of a preferred embodiment thereof, which description should be considered in conjunction with the accompanying drawings.

DESCRIPTION OF THE PREFERRED EMBODIMENT

Figure 1:
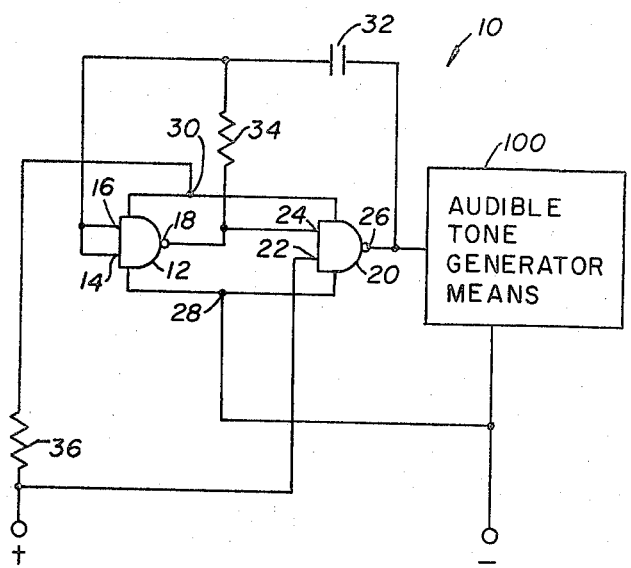
FIG. 1 is a schematic illustration of a circuit means for providing a single audible signal from an audible tone generator means.

Illustrated in the above described FIGURES are various schematics showing the present invention for producing a plurality of distinguishable audible signals from an audible tone generator means 100. In particular the present invention will be described with respect to its adaptation to producing at least two distinguishable audible signals for indicating the existence or nonexistence of two or more conditions. However, it will be understood by those skilled in the art associated with the present invention after reading the description provided hereinafter, that it and/or any method associated with its operation may be adoptable to any situation where at least two distinguishable audible signals are desirable from a single audible producing package.

Since various electrical components illustrated in the various FIGURES described above are identical, corresponding reference characters used in the several FIGURES are intended to indicate corresponding components throughout the FIGURES. Furthermore, unless otherwise specifically described, corresponding components function in the same manner and therefore, once their function is initially described it will not again be described thereafter.

Referring now to the above described FIGURES and more particularly to FIG. 1, a circuit means 10 for providing an interrupted audible signal is schematically illustrated as it would be adopted to any conventional audible tone generator means 100. Circuit means 10 includes two two-input NAND gates 12 and 20 which may comprise a Dual two-input NAND gate integrated circuit package. Inputs 14 and 16 of gate 12 are commonly electrically coupled to a first side of a resistor 34 and a first side of a capacitor 32. An input 22 of gate 20 is electrically coupled to the positive (+) side of a power supply source (not shown) and another input 24 of gate 20 is electrically coupled to a second side of resistor 34 and to an output 18 of gate 12. An output 26 of gate 20 is electrically coupled to a second side of capacitor 32 and to audible tone generator means 100. Accordingly, the output 26 of gate 20 is also the output of circuit means 10. As coupled in the manner described above, circuit means 10 forms a multivibrator circuit wherein the NAND gates 12 and 20 operate as switching inverters and the outputs 18 and 26 of the gates 12 and 20 respectively provide a discharge and charge path respectively for capacitor 32. The voltage levels associated with inputs 14 and 16 of NAND gate 12 determine the switching levels for gates 12 and 20.

A negative voltage terminal 28 of the NAND gate integrated circuit package is electrically coupled to the negative (−) side of the previously referenced power supply source (not shown) and a positive voltage terminal 30 of the NAND gate integrated circuit package is electrically coupled through a resistor 36 to the positive (+) side of the power supply source (not shown). Resistor 36 serves as a transit protection means for protecting circuit means 10 from electrical transient voltages.

In operation, when the positive (+) side of the power supply source is applied to the input 22 of NAND gate 20 the output 26 is caused to be a logical one (1) which substantially charges capacitor 32 and applies logical one (1) signals to the inputs 14 and 16 of NAND gate 12 thereby causing its output to be a logical zero (0) and providing a discharge path for capacitor 32 through resistor 34 and output 18 of gate 12. During the time capacitor 32 is charging the logical one (1) output 26 of NAND gate 20 is supplied to audible tone generator means 100 so that an audible signal is produced, but only until capacitor 32 is substantially discharged. Once capacitor 32 has substantially discharged the audible signal is interrupted for a time period required for capacitor 32 to again charge. Accordingly, as the output 26 of NAND gate 20 changes from a logical one (1) to logical zero (0) state and vice versa, an audible signal is provided which is periodically interrupted.

Figure 2:
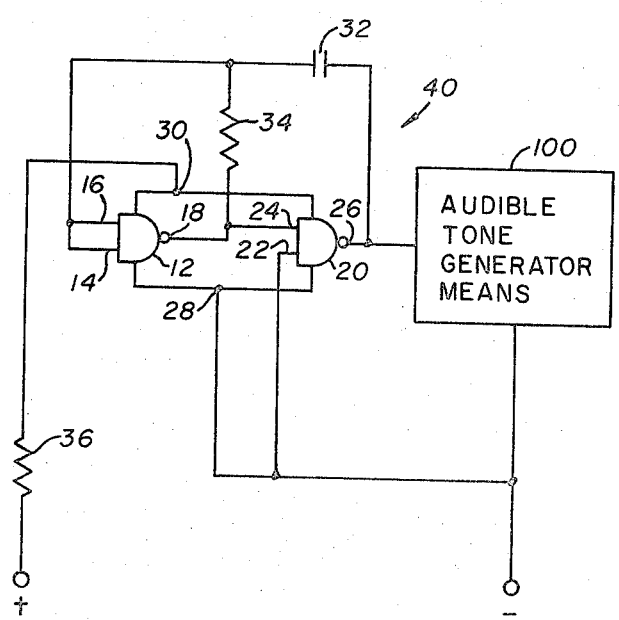
FIG. 2 is a schematic illustration of a circuit means for providing a single audible signal from an audible tone generator means where the audible signal is distinguishable from that produced from the circuit illustrated in FIG. 1.

Referring now specifically to FIG. 2, a circuit means 40 for providing a continuous audible signal is schematically illustrated as it would be adopted to any conventional audible tone generator means 100. As shown, circuit means 40 includes all of the same electrical components as shown and previously described in FIG. 1. However, in FIG. 2 (circuit means 40) the input 22 of NAND gate 20 which in circuit means 10 was electrically coupled to the positive (+) side of the power supply source is now shown to be electrically coupled to the negative (−) side of the power supply source. Except for this important physical difference between circuit means 10 and circuit means 40, the only other differences are functional.

Accordingly, in operation, when the negative (−) side of the power supply source is applied to the input 22 of NAND gate 20 the output 26 of gate 20 is caused to be a logical one (1) which substantially charges capacitor 32 and applies logical one (1) signals to the inputs 14 and 16 of NAND gate 12 thereby causing its output 18 to be a logical zero (0). With the output 18 of NAND gate 12 as logical zero (0) both of the inputs 22 and 24 of NAND gate 20 are latched in logical zero (0) states thereby latching the output 26 of gate 20 in a logical one (1) state. Accordingly, capacitor 32 is maintained substantially charged. The logical one (1) output 26 of NAND gate 20 is supplied to audible generator means so that an audible signal is produced continuously or until such time as the negative (−) side of the power supply source is removed from input 22 of NAND gate 20. As herein described, the output 26 of NAND gate 20 is always logical one (1) thereby providing an uninterrupted electrical signal at the output 26 so that a continuous audible signal is produced by audible tone generator means 100.

Figure 3:
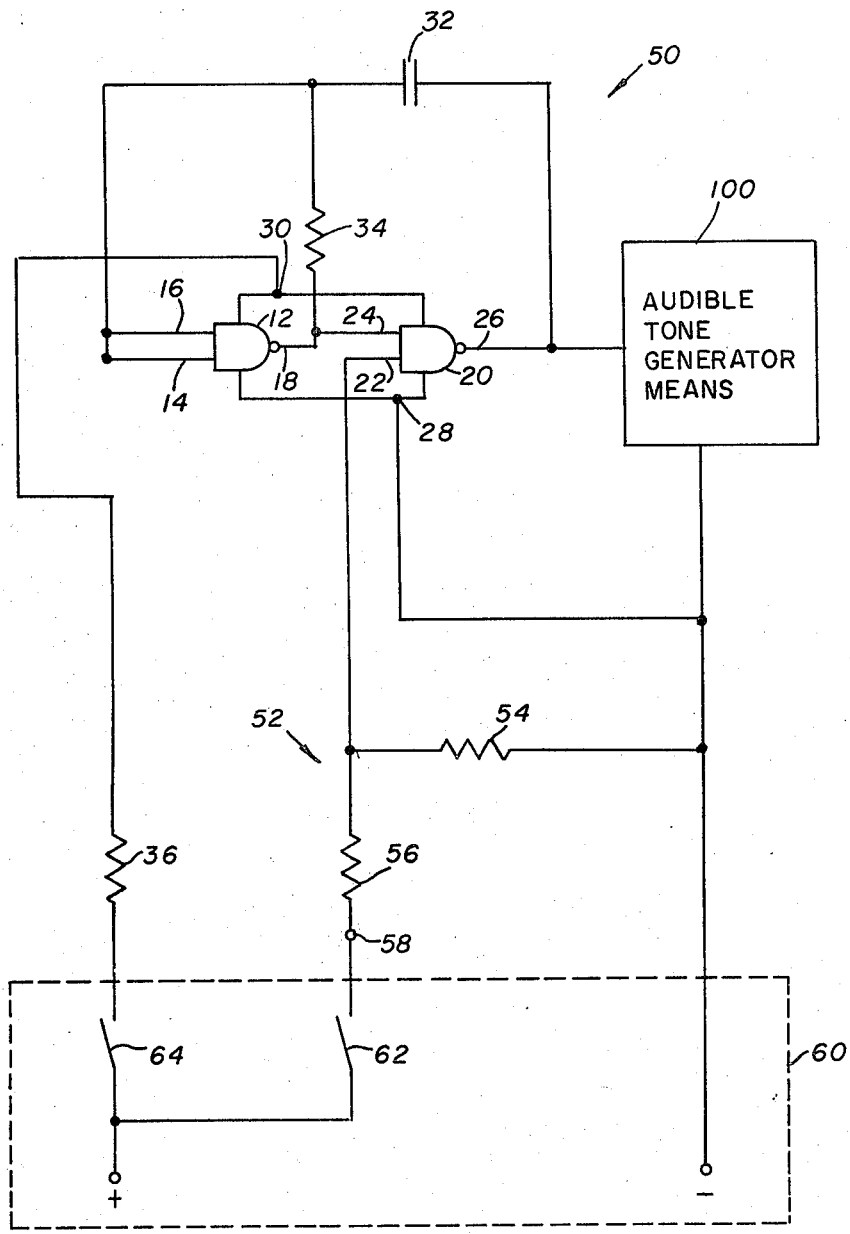
FIG. 3 is a schematic illustration of a circuit means for providing multiple audible signals from an audible tone generator means each distinguishable from the other.

Referring now specifically to FIG. 3, a circuit means 50 for providing both a continuous and an interrupted audible signal is schematically illustrated as it would be adapted to any conventional audible tone generator means 100. As shown, circuit means 50 is a combination of circuit means 10 and 40 illustrated in FIGS. 1 and 2 and described hereinabove with the addition of a voltage divider network 52 comprising resistors 54 and 56 and a single control terminal 58. Accordingly, with the exception of these additions, the electrical components of circuit means 50 are the same as those previously described.

Voltage divider network 52 in conjunction with resistor 36, previously described, serve to provide transient protection for the integrated circuit package from spurious signals which may occur through either the power supply source or control terminal 58. Specifically, resistor 54 is provided to produce a substantially logical zero (0) signal at the input 22 of NAND gate 20 if the control terminal 58 has no electrical signal applied to it. Importantly, the ratio of the resistance values of resistors 56 and 54 to each other respectively of voltage divider network 52 should be small so that when the positive (+) side of the power supply source is applied to the control terminal 58, a logical one (1) signal is supplied to input 22 of NAND gate 20.

For purposes of describing its operation, circuit means 50 is illustrated in FIG. 3 in conjunction with a switching arrangement 60 including switches 62 and 64 whereby either a continuous or an interrupted audible signal is produced by audible tone generator means 100 in response to the existence or nonexistence of various conditions represented by switches 62 and 64. The use of switching arrangment 60 is not intended to be limiting in any manner but is only intended for illustrative purposes.

Accordingly, in operation, when a condition exists represented by switch 64 whereby only switch 64 is caused to close, power is applied to circuit means 50. Since switch 62 remains open, control terminal 58 has no electrical signal applied to it. Resistor 54 therefore assures that a substantially logical zero (0) signal or ground (zero) potential is applied to input 22 of NAND gate 30. With a logical zero (0) at input 22 of NAND gate 20, circuit means 50 operates in the manner previously described and illustrated in FIG. 2 for circuit means 40 thereby latching the output 26 of NAND gate 20 in a logical one (1) state and providing a constant signal to allow audible tone generator circuit means 100 to produce a continuous audible signal.

When a condition exists represented by switches 62 and 64 in combination whereby both switches 62 and 64 are caused to close, power is applied to circuit means 50 and a logical one (1) signal is applied to input 22 of NAND gate 20. With a logical one (1) at input 22 of NAND gate 20, circuit means 50 operates in the manner previously described and illustrated in FIG. 1 for circuit means 10 thereby periodically changing the output 26 of NAND gate 20 from a logical one (1) state to a logical zero (0) state and vice versa and further providing an interrupted electrical signal to audible tone generator means 100 which results in an interrupted audible signal.

It is therefore important to note that by utilizing only one terminal e.g. control terminal 58, in addition to the positive (+) and the negative (−) sides of a power supply source, the circuit means 50 of the present invention provides for multiple audible signals from an audible tone generator means 100 wherein each audible signal is distinguishable from the other. The simplicity and compactness of circuit means 50 makes it an economical and space saving means of providing multiple audible signals from an audible tone generator means 100.

Figure 4:
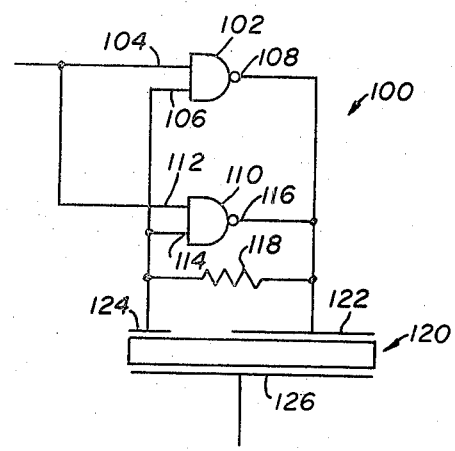
FIG. 4 is a schematic illustration exemplary of an audible tone generator means for which the present invention is adaptable.

Illustrated in FIG. 4, is an example of a conventional audible tone generator means 100 for producing an audible signal. It will be understood by those skilled in the art that other audible tone generator means 100 may be utilized in conjunction with circuit means 10, 40 and 50 such as for example an electromechanical buzzer, horn or speaker and their associated circuitry. The audible tone generator means 100 illustrated in FIG. 4 is that which is preferred in conjunction with circuit means 50.

Audible tone generator means 100 for producing an audible signal incorporates two two-input NAND gates 102 and 110 which may comprise another Dual two input NAND gate integrated circuit package or w;hich may be a portion of a Quad two-input NAND gate integrated circuit package. A piezoelectric transducer 120 includes electrodes 122, 124 and 126. Electrode 126 would be electrically coupled to the negative (−) side of the pwoer supply source. An input 104 of NAND gate 102 and an input 112 of NAND gate 110 each would be electrically coupled to the output 26 of NAND gate 28 of circuit means 50. An input 106 of NAND gate 102 and an input 114 of NAND gate 110 are commonly electrically coupled to a first side of a resistor 118 and to electrode 124 of piezoelectric transducer 120. An output 108 of NAND gate 102 and an output 116 of NAND gate 110 are commonly electrically coupled to a second side of resistor 118 and electrode 122 of transducer 120. In combination, the coupling of NAND gates 102 and 116 in the manner described hereinabove forms a means 100 for amplifying the electrical signal provided by electrode 124 of transducer 120 such that transducer 120 is driven substantially at its resonant frequency.

In operation, NAND gates 102 and 110 are electrically coupled in parallel and cooperate with piezoelectric transducer 120 in an oscillitory manner so that transducer 120 is excited into vibration near its resonant frequency and an audible signal is produced. Electrode 124 of transducer 120 provides a feedback voltage of a magnitude and phase to permit sustained oscillations in the circuit. When the voltage supplied form output 26 of NAND gate 20 to inputs 104 and 112 of NAND gates 102 and 110 is near the supply voltage (logical one (1)), osciallation will occur in audible tone generator circuit 100 and an audible signal will be produced. When voltage from output 26 is low or near ground potential (logical zero (0)) the oscillations cease and no audible signal will be produced.

In view of the above description of the preferred embodiment of the present invention it will be seen that the several objects of the invention are achieved and other advantageous results attained and that further modifications can be made without departing from the spirit and scope of the invention as defined in the appended claims.

What is claimed is:

1. Circuit means for providing multiple audible signals from an audible tone generator means comprising: at least two logic gates each having an output and at least two inputs, the output of a first logic gate determining an audible signal produced by the audible tone generator means, and a single control terminal for controlling the outputs of both logic gates, the output of the first logic gate being latched in a logical one state in response to the output of a second logic gate to produce a continuous audible signal when power is applied to the circuit and a logical zero is applied to the control terminal, the outputs of the first and second logic gates providing charge and discharge paths respectively for a capacitor to produce a periodically interrupted audible signal when power is applied to the circuit and a logical one is applied to the control terminal.

2. The circuit means as recited in claim 1 wherein an input of the first logic gate is electrically coupled to the control terminal whereby a logical state of the input is determined by the electrical potential present at the control terminal and the two inputs of the second logic gate are commonly electrically coupled to the output of the first logic gate.

3. A method for providing multiple audible signals from an audible tone generator means comprising the steps of: latching an output of a first logic gate in a logical one state to continuously drive the audible tone generator; charging and discharging a capacitor through the output of the first logic gate and an output of a second logic gate respectively to periodically drive the audible tone generator; and controlling the latching, charging, and discharging from a single control terminal with the absence and presence of an electrical signal respectively to produce continuous and periodically interrupted audible signals to indicate various conditions.

* * * * *